United States Patent [19]
Pain et al.

[11] Patent Number: 5,886,659
[45] Date of Patent: Mar. 23, 1999

[54] ON-FOCAL-PLANE ANALOG-TO-DIGITAL CONVERSION FOR CURRENT-MODE IMAGING DEVICES

[75] Inventors: Bedabrata Pain, Los Angeles, Calif.; Junichi Nakamura, Tokyo, Japan; Eric R. Fossum, LaCrescents, Calif.

[73] Assignee: California Institute of Technology, Pasadena, Calif.

[21] Appl. No.: 916,992

[22] Filed: Aug. 21, 1997

Related U.S. Application Data

[60] Provisional application No. 60/024,750, Aug. 21, 1996 and provisional application No. 60/024,752, Aug. 21, 1996.

[51] Int. Cl.[6] ................................................. H03M 1/12
[52] U.S. Cl. ............................ 341/155; 341/144; 348/292
[58] Field of Search ...................................... 341/172, 155, 341/100, 144; 348/294, 312, 311

[56] References Cited

U.S. PATENT DOCUMENTS 5,796,361  8/1998  Levinson ................................. 341/172

OTHER PUBLICATIONS

Jacques Robert & Philippe Deval, "A Second–Order High–Resolution Incremental A/D Converter with Offset and Charge Injection Compensation", Jun. 1988, *IEEE J. Solid–State Circuits*.

*Primary Examiner*—Brian Young
*Attorney, Agent, or Firm*—Fish & Richardson P.C.

[57] ABSTRACT

A current-mode analog-to-digital converter based on a current copier circuit with a constant bias current that is independent of the input signals. A second-order incremental $\Sigma$-$\Delta$ conversion configuration is implemented. An array of such analog-to-digital converters can be integrated onto the focal plane of an imaging sensor array to achieve column-wise parallel analog-to-digital conversion.

12 Claims, 14 Drawing Sheets

ON-FOCAL-PLANE ANALOG-TO-DIGITAL CONVERSION FOR CURRENT-MODE IMAGING DEVICES

This application claims the benefits of the U.S. Provisional Application Nos. 60/024,750 and 60/024,752, both filed on Aug. 21, 1996, the disclosure of which is incorporated herein by reference in its entirety.

FIELD OF THE INVENTION

The present invention generally relates to analog-to-digital conversion, and more particularly, to current-mode analog-to-digital converters for on-focal-plane imaging devices.

ORIGIN OF THE INVENTION

The invention described herein was made in the performance of work under a NASA contract, and is subject to the provisions of Public Law 96-517 (35 U.S.C. 202) in which the Contractor has elected to retain title.

BACKGROUND OF THE INVENTION

Analog-to-digital conversion is widely used in electronic systems. Some conventional electronic systems package an analog-to-digital converters (ADC) on a separate integrated circuit. To reduce the size, power consumption, and manufacturing and design cost, it is often desirable to integrate ADCs and other functional circuits on a single circuit chip. Such integration also improves the system reliability, noise resistance and chip-to-chip interfacing.

One application for the integrated ADC technology is in the field of semiconductor imaging devices. A typical semiconductor imager includes an array of photo sensors and processing circuits. An optical image captured by the imager is first converted into analog electrical signals and then processed by the processing circuits in either analog mode or digital mode. A digital image sensor senses an optical image and outputs a digital representation of the image. Many applications requires digital image sensors for digital image manipulation, digital data storage and transmission. Therefore, analog-to-digital converters are needed in the signal train of a digital image sensor.

In addition to considerations of circuit size, power consumption, and cost, integrating ADCs with a sensing array of a digital image sensor allows the analog signals to be converted into the digital format at an early stage in the signal chain and thus significantly improves the noise performance. This is in part because an early analog-to-digital conversion reduces signal degradation due to noise and nonlinearities in analog transmission and processing.

SUMMARY OF THE INVENTION

It is an object of the present invention to achieve on-focal-plane analog-to-digital conversion in a semiconductor imaging device based on a current-mode circuitry.

It is another object of the invention to provide a high speed and high resolution current-mode ADC with a minimal ADC error caused by the integration gain and circuit noise.

It is a further object of the invention to provide a current-mode ADC with reduced chip area and power consumption.

One embodiment of the imaging device in accordance with the invention includes a current-mode sensing array with sensing pixels in rows and columns and an on-focal-plane ADC array. The ADC array has a plurality of current-mode ADCs each corresponding to one column of sensing pixels in the sensing array. The ADCs are electrically parallel to one other and process analog signals from columns in parallel. Preferably, the architecture utilizes a CMOS charge-integrating amplifier, resulting in an ADC well suited for CMOS compatible focal-plane applications.

The current-mode ADC according to one aspect of the invention may include at least one first-order $\Sigma$-$\Delta$ modulator based on a current copier cell with a constant bias that is independent of the input signals. The first-order $\Sigma$-$\Delta$ modulator comprises a current integrator, a current comparator and a negative digital-to-analog feedback loop. Two or more of such a first-order $\Sigma$-$\Delta$ modulator may be cascaded to form a second-order or multiple-order incremental $\Sigma$-$\Delta$ ADC to achieve high-precision and high-resolution analog-to-digital conversion.

These and other aspects and advantages of the present invention will become more apparent in light of the following detailed description, the accompanying drawings, and the claims.

DETAILED DESCRIPTION OF THE INVENTION

Architecture of Sensing Array with On-Focal-Plane ADC

One or more analog-to-digital converters may be implemented on a focal plane of a semiconductor imaging device with various architectures depending on the specific requirements of the applications.

Figure 1A:
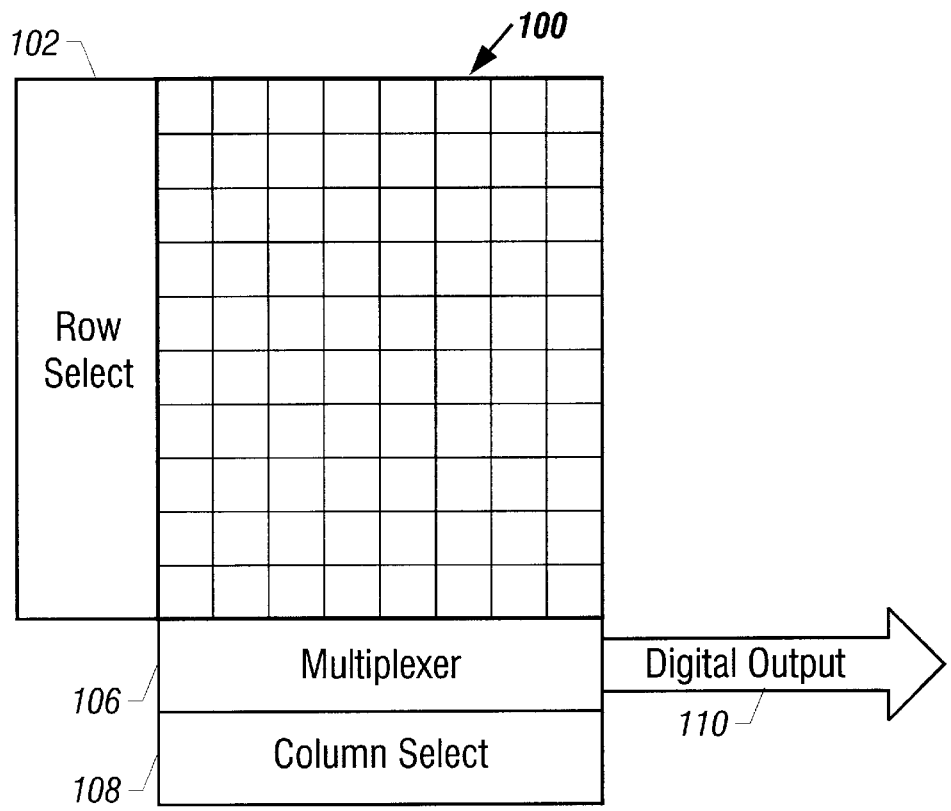
FIGS. 1A, 1B, and 1C are block diagrams showing examples of imagers with on-focal-plane ADC converters of the invention.

FIG. 1A shows one architecture of such implementation according to the invention. A sensor array 100 includes a plurality of sensing pixels arranged in rows and columns. Each sensing pixel has a semiconductor photo sensor and an integrated ADC. Thus, an optical stimulus received by each pixel is directly converted into a digital signal and the output of the sensor array 100 is a digital representation of the input image. Pixel addressing circuits, i.e., row select 102 and column select 108, are used to address any one or multiple pixels and fetch data from selected pixels. The digital output is produced at a multiplexer 106.

Figure 1B:
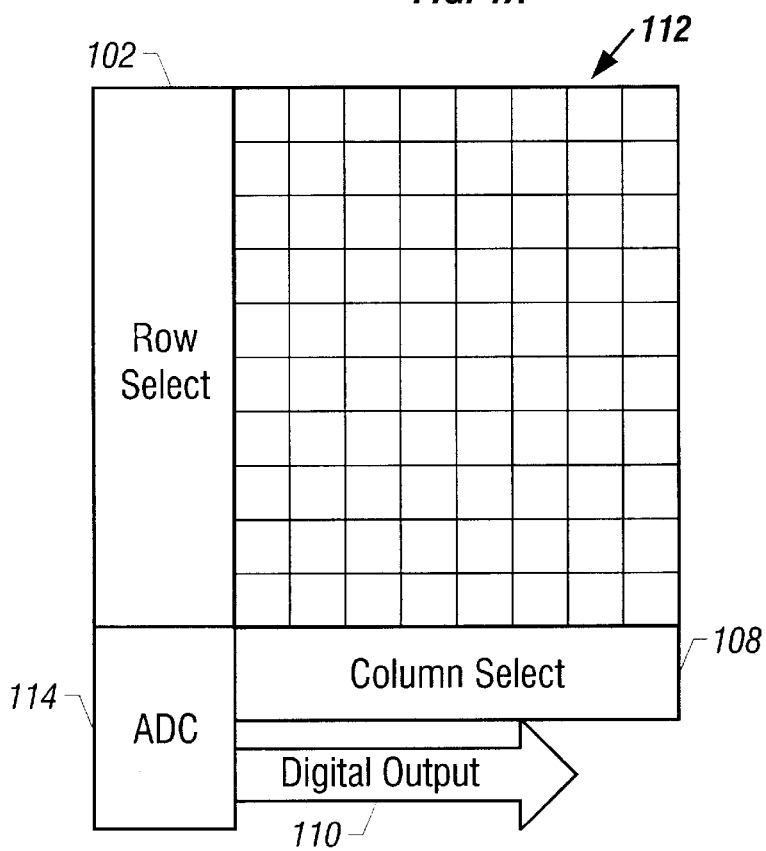

Another architecture integrates a single ADC on the focal plane of a sensor. Referring to FIG. 1B, an analog sensor array 112 converts an input image into an array of analog electrical signals. An ADC 114 that is connected to both the row select 102 and column select 108 converts the analog signals into digital signals according to a sequence determined by the row select 102 and column select 108.

Figure 1C:
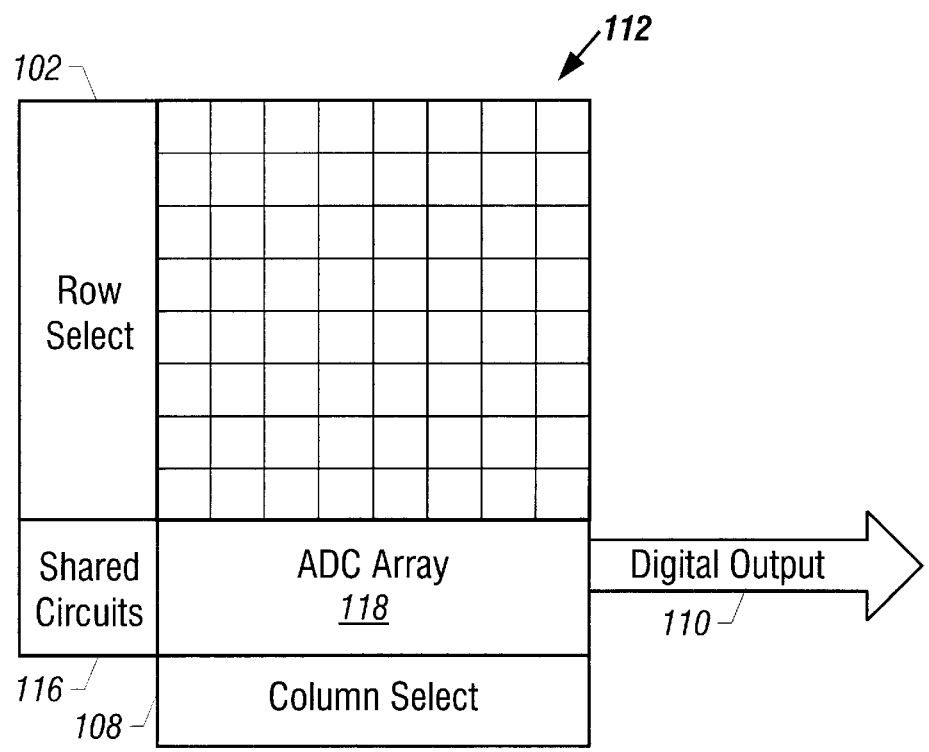

FIG. 1C shows yet another architecture that integrates a one-dimensional ADC array 118 to the analog sensor array 112. Two configurations may be implemented in this architecture. The first configuration uses an ADC array with same number of ADCs as the number of columns in the analog sensor array 112. Each column is designated to one ADC. The second configuration uses an ADC array in which the number of ADCs is less than the number of columns. One ADC is thus connected to two or more columns by multiplexing. In either configuration, all ADCs are in parallel with respect to one another so that each ADC can operate at a lower rate than the single ADC in FIG. 1A.

The photo sensor in each pixel for the array 100 or 112 in FIGS. 1A, 1B, and 1C can be any photo sensing element such as a photo transistor, a photodiode, a CCD detector, a charge injection device or a hybrid focal plane array. A preferred photo sensor is a CMOS active pixel sensor ("APS") which includes a light sensing element and one or more active transistors within the pixel itself. The active transistors amplify and buffer the signals generated by the light sensing elements in the pixels. One type of such APS devices is disclosed in U.S. Pat. No. 5,471,515 to Fossum et al., the disclosure of which is incorporated herein by reference.

A focal-plane analog-to-digital converter in a digital imager may eliminate a number of noise sources associated with analog circuits such as cross-talk, clock pickup, power supply noise, electromagnetic interference, and off-chip analog cabling noise. In particular, integration of ADCs in parallel (FIGS. 1A and 1C) can reduce the clock rate at which an integrated ADC operates to achieve the full video frame comparing to analog circuits with an off-chip serial ADC since the serial data rate in the signal chain is typically the highest rate in the entire imaging system which introduces white noise with a maximum bandwidth. The parallel on-chip ADC architecture also alleviate effects of clock noise and other capacitively-coupled noise sources that are known to increase with increasing data rates. In addition, multiple sampling, or over-sampling, of the detector signal can be effectively performed on the focal plane to further increase the signal-to-noise ratio. On-focal-plane ADCs can also lead to a reduction in the total power dissipation in the focal plane array.

Furthermore, digital signals can be digitally processed on-chip as a further level of integration. For example, on-chip digital signal processing can be used for autonomous sensor control, e.g. exposure control, or for control, of windowed region-of-interest readout. Image compression can also be achieved on-chip to reduce off-chip drive requirements.

The incorporation of high resolution ADCs on focal-plane arrays has proved to be a difficult challenge. There is much less silicon area available on focal-plane arrays than on stand-alone ADCs. An ADC with serial architecture would be required to operate with the highest bandwidth of all focal-plane components, since the conversion rate would be the same as the pixel data rate. In certain applications such as a scientific application, a typical pixel data rate can range from about 100 KHz to a over 100 MHZ. The reliability of CMOS at such high data rates circuits is also a concern.

High ADC converting resolutions generally requires over-sampling techniques that drive the ADC clock rate even higher. On-chip ADCs would also increase focal-plane power dissipation because of the required high speed operation of several analog circuits; compared to the single driver amplifier used in conventional focal-plane readouts. Therefore, the serial on-focal-plane ADC architecture as is shown in FIG. 1B may be applied in applications with a relatively low resolution (e.g., usually 8 bits or lower) and a slower frame rate.

The architecture of FIG. 1A implements maximum parallelism by integrating one ADC on each readout pixel in the focal-plane array. Since a relatively small area is available for each pixel in most applications (typical pixel size is about 30 $\mu m^2$), a non-conventional compact ADC approach is desirable for such implementation.

The system of FIG. 1C: is an example of the semi-parallel architecture in which multiple pixels share one on-focal-plane ADC in the ADC: array 118. This architecture provides a compromise between reduction of ADC operation rate and reducing pixel size. The system of FIG. 1C would, for example, utilize an ADC for every column of the readout. This affords few problems with area in one dimension and tight, but feasible, design space in the other dimension based on the degree of integration of the columns. Such tall, skinny, ADCs would operate, in parallel, on one row of image data at a time.

A number of ADC techniques are available for use in focal-plane applications. These conversion methods differ from each other in terms of operating speed, power consumption, achievable accuracy, and chip area. An important difference between on-focal-plane ADC and a single chip monolithic ADC, is that an on-focal-plane ADC must occupy a relatively small chip area. The real estate becomes an even more serious concern for column-parallel approaches. Due to the unavailability of a large chip area, focal-plane ADCs cannot usually take advantage of elaborate trimming techniques for resolution enhancement. Thus, the immunity of the ADC performance to circuit parameter mismatch is a problem.

Low power operation is preferred in focal-plane ADCs. Maximum overall power dissipation in the combined ADCs would typically be limited to between one and 20 mW. The required resolution and conversion rates vary widely depending upon applications. The conversion rate depends on the array size, the integration time, and the choice of ADC architecture. The rate is usually in the range of 1 KHz to 1 MHZ. Scientific infrared imagers usually demand high resolution (greater than 16 bits), but several other applications require only eight to ten bit accuracy. Thus there is a wide range of operating requirements. Conversion rate requirements vary from 1 kHz to 1 MHZ, and the bit resolution requirements vary from six to over sixteen bits. There does not appear to be a single ADC algorithm that optimally meets all of these widely varying requirements.

Candidate ADC algorithms which meet some of these constraints include flash ADCs, successive approximation ADCs, single/dual slope ADCs, and over-sampled delta-sigma ADCs. For ADC operation in the two to ten bit range, the inventors have recognized that the successive approximation ADC is an attractive alternative for focal-plane applications. This kind of ADC achieves high resolution at medium speeds and with minimal power dissipation. One advantage with successive approximation is that for n bits, only n comparisons need to be made. This results in high speed and low power dissipation. Furthermore, this architecture does not require excessive chip area.

The successive-approximation analog-to-digital conversion process is essentially a "ranging" algorithm. Each conversion step estimates the upper and lower bound within which the input voltage lies. The analog voltage is approximated to within a small error by successively shrinking these bounds. The ranging can be done in several ways. One successive-approximation algorithm that is compatible with CMOS implementation is described in S. Ogawa, et al., "A switch-capacitor successive-approximation A/D converter", IEEE Trans. Instrum. and Meas., Vol. 42, pp. 847–853, 1993. One disadvantage with that approach is that the residual voltage decimates to approximately $V_{ref}/2^n$ after n conversion steps. As a result, the ADC can become susceptible to circuit no-se, offset and non-idealities.

An ADC suitable for on-focal-plane integration according to the invention can be either a voltage-mode circuit which primarily processes voltage signals or a current-mode circuit which primarily processes current signals. Examples of a voltage-mode ADC are disclosed in, for example, U.S. patent application Ser. No. 08/744,955, filed on Nov. 7, 1996, entitled "SUCCESSIVE APPROXIMATION ANALOG-TO-DIGITAL CONVERTER USING BALANCED CHARGE INTEGRATING AMPLIFIERS", Ser. No. 08/744,957, filed on Nov. 7, 1996, entitled "CAPACITIVELY COUPLED SUCCESSIVE APPROXIMATION ULTRA LOW POWER ANALOG-TO-DIGITAL CONVERTER", and Ser. No. 08/906,402, filed on Aug. 5, 1997, entitled "CHARGE INTEGRATION SUCCESSIVE APPROXIMATION ANALOG-TO-DIGITAL CONVERTER FOR FOCAL PLANE APPLICATIONS USING A SINGLE AMPLIFIER", all of which are incorporated herein by reference.

Current-mode ADCs are based on the facts that the output of a sensing pixel in certain configurations can be a current signal. A charge modulation device image sensor is such a device. Matsumoto et al., "The operation mechanism of a charge modulation device (CMD) image sensor," IEEE Trans. Electron Devices, pp. 989–990, May, 1991. CMOS APS devices with a photodiode or a photogate may also be configured to generate current signals.

Figure 2A:
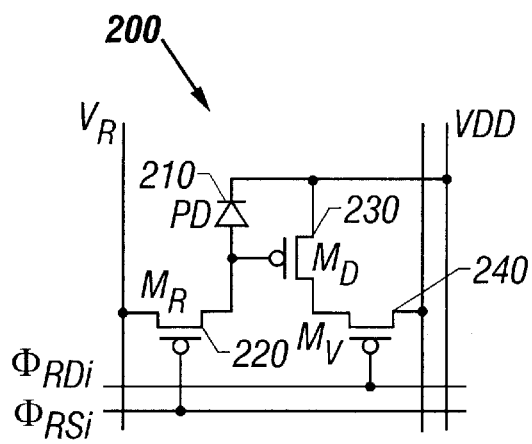
FIG. 2A is a circuit of a current-mode active pixel sensor pixel having a photo diode for light sensing.

FIG. 2A shows a current-mode CMOS pixel 200 with a photodiode 210 and three CMOSFETs 220, 230, and 240. Although p-type transistors are shown here n-type transistors may also be used. The output of the pixel 200 is a current induced by a voltage change on the photodiode 210. See, Nixon et al., "256×256 CMOS active pixel sensor camera-on-a-chip," IEEE J. Solid-State Circuits, Vol. 31(12), pp. 2046–2051 (1996), which is incorporated herein by reference.

Figure 2B:
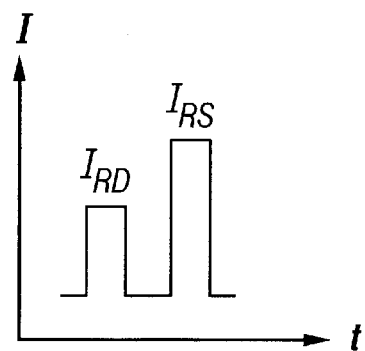
FIG. 2B shows the current pulse sequence of the circuit of FIG. 2A.

The operation of the pixel 200 is as follows. First, the photodiode 210 is reset at an initial voltage $V_R$ by pulsing transistor 220 ($M_R$) with a pulse $\phi_{RSi}$, where i denotes the i-th row. During the integration period, photo-induced holes are accumulated at the photodiode 210 and raises the voltage of the photodiode by $Q_{sig}/C_{PD}$, where $Q_{sig}$ is the accumulated charge and $C_{PD}$ is the capacitance associated with the photodiode 210. During the readout period, a current $I_{pixel}$ flows into the readout circuitry when the vertical select switch transistor 240 ($M_v$) is turned on the a pulse $\phi_{RDi}$. FIG. 2B shows the current pulse sequence in the operation.

Figure 3A:
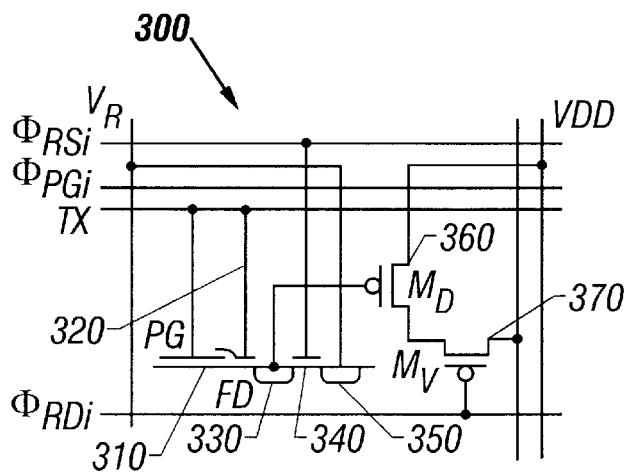
FIG. 3A is a circuit of a current-mode active pixel sensor pixel having a photogate for light sensing.
Figure 3B:
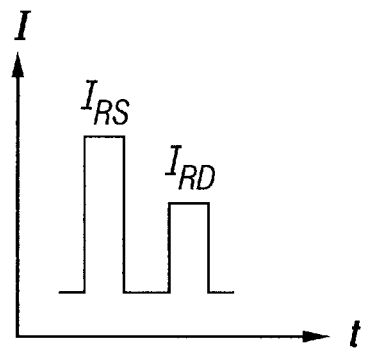
FIG. 3B shows the current pulse sequence of the circuit of FIG. 3A.

As another example, a current-mode CMOS APS pixel 300 with a photogate 310 is shown in FIG. 3A. See, Mendis et al., "A 128×128 CMOS active pixel sensor for highly integrated imaging systems," IEDM Tech. Dig., pp. 583–586 (1993), which is incorporated herein by reference. The charge transfer circuit in the pixel 300 includes a transfer gate electrode 320 adjacent to the photogate 310, a floating diffusion 330, a reset electrode 340 and a drain diffusion 350.

In operation, the floating diffusion 330 is reset at VR in a similar manner to operating the photodiode pixel 200 in FIG. 2A. During an integration period, the electrode of the photogate 310 is held by a photogate signal PG at a positive voltage to form a potential well in the substrate in which photo-generated charge is accumulated. The transfer gate electrode 320 is initially DC biased at an appropriate value (e.g., a less positive DC voltage) by a transfer gate signal TX to form a potential barrier so that excess charge is drained to the floating diffusion 330 which results in high blooming overload protection. Upon completion of the integration period, the photogate 310 turns off and the charge is dumped to the floating diffusion 330. During the period when a vertical select transistor 370 is turned on, the current $I_{pixel}$ corresponding to the voltage on the floating diffusion 330 is obtained.

Figure 4:
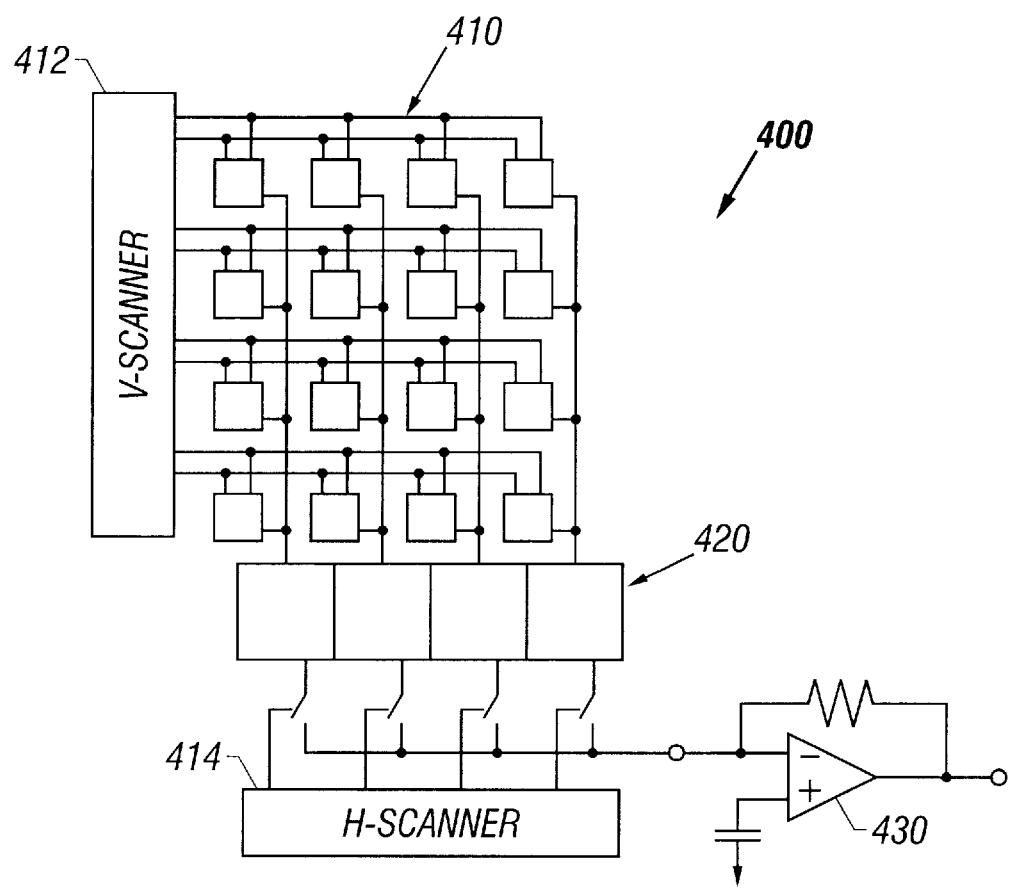
FIG. 4 is a diagram of a current-mode active pixel sensing array with on-chip circuits for reducing fixed pattern noise.

An offset current can change from pixel to pixel and cause a fixed and different bias in the output signal. This is the current-mode fixed pattern noise (FPN). FPN can be suppressed by using an on-chip FPN suppressing circuit as shown in FIG. 4. Pixel array 410 is a current sensing array with pixels arranged in rows and columns. A row select 412 and a column select 414 are used to address the pixels. An array of FPN suppressing circuits 420 are connected to columns of the array 410. An optional off-chip current-to-voltage amplifier 430 may also be implemented.

For a photodiode array (FIG. 2A), the current $I_{RD}$ is a sum of the signal current $I_{SIG}$ and the offset current $I_{off}$. This current $I_{RD}$ is first stored in a FPN suppression circuit. Next, the pixels on the selected row are reset and the current $I_{RS}$ which is the offset current $I_{off}$ is memorized in the FPN suppression circuit. The FPN suppression circuit then outputs the difference $I_{out}$ between the $I_{RD}$ and $I_{RS}$ which is free of the column-dependent offset current $I_{off}$.

For a photogate APS array as shown in FIG. 3A, the floating diffusion 330 is reset at first and the current $I_{RS}$ is read out. After dumping the signal charge to the floating diffusion, the current $I_{RD}$ is read out. By taking the difference between the $I_{RD}$ and $I_{RS}$, FPN is suppressed. In addition, kTC noise associated with resetting the floating diffusion is also suppressed. Thus, photogate APS devices can have better noise performance than photodiode APS devices.

Current-mode sensing arrays with on-focal-plane ADCs may be configured to have certain advantages over their voltage-mode counterparts for some applications. For example, a change in current can be faster than a change in voltage and thus a faster processing speed may be obtained. Also a current-mode ADC can be made less sensitive to component variations than a voltage-mode ADC.

Circuit Design of Current-Mode Second-Order Σ-Δ ADC

Current-mode Σ-Δ ADCs are based on oversampling. It is known that quantization noise in analog-to-digital conversion can be considered as white noise distributed from DC to the Nyquist sampling frequency. Thus, by increasing the sampling frequency, the quantization noise can be reduced since the total noise poser is constant. Σ-Δ analog-to-digital conversion produces a high signal-to-noise ratio (SNR) by placing the most of the quantization noise power outside the useful signal band. Due to this improved SNR, requirements for many analog components in a circuit may be relaxed. Candy and Temes, "Oversampling methods for A/D and D/A conversion," pp. 1–25, in Oversampling delta-sigma data converters, IEEE Press, New York (1992).

A first-order Σ-Δ ADC combines sampling at rates well above the pixel readout rate with negative feedback to exchange resolution in time with that in amplitude. See, Boser and Wooley, "The design of sigma-delta modulation analog-to-digital converters," IEEE J. Of Solid State Circuits, Vol. SC–23, pp. 1298–1308 (1988), which is incorporated herein by reference. The algorithm for the first-order Σ-Δ ADC is $$I(i+1) = I(i) + \alpha(I_{in} - b_i I_{ref}), \qquad (1)$$

where $$b_i \begin{cases} 1, & I(i) + I_{in} \geq 0; \\ 0, & I(i) + I_{in} < 0. \end{cases} \quad i = 1, 2, \ldots n. \qquad (2)$$

$I(1)=I_{in}$ and $I_{ref}$ is the reference current. The range of the output is $-I_{ref} < I < I_{ref}$. The repeated integration and feedback force the average value of the output to track the average value of the input and any uncorrelated variations (e.g., noise) are suppressed. The algorithm is also tolerant to component mismatches, non-idealities, and circuit offsets.

Figure 5A:
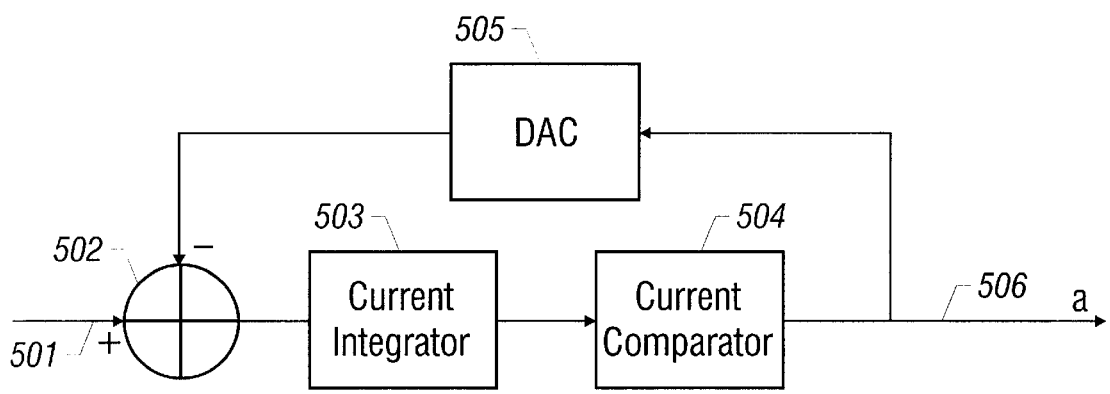
FIG. 5A is a block diagram illustrating a first-order $\Sigma$-$\Delta$ analog-to-digital converter.

FIG. 5A shows a first-order Σ-Δ modulator. The modulator has a current mixer 502, a current integrator 503, a current comparator 504 and a first digital-to-analog converter (DAC) 505. The DAC 505 forms a feedback loop by connecting the output of the comparator 504 to the mixer 502. Note that a feedback signal from the DAC 505 is phase shifted by 180° with respect to the input to the signal mixer 502.

Figure 5B:
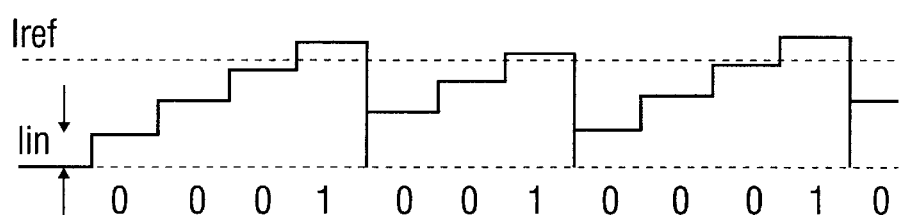
FIG. 5B is a diagram showing the digital output of the device in FIG. 5A.

FIG. 5B illustrates the typical event sequence and output levels of a first-order Σ-Δ ADC where Iref is the reference current of the converter and Iin is the input current to be digitized. The comparator output 506 is used to increment a counter that contains the digital number representation of the analog input 501 at the end of the conversion. It takes $2^n$ cycles for a first-order Σ-Δ ADC of FIG. 5A to perform a n-bit A/D conversion.

Two first-order Σ-Δ ADCs may be cascaded to form a second-order incremental Σ-Δ ADC. This increases the conversion speed and further reduces the noise. Robert and Deval, "A second order high-resolution incremental A/D converter with offset and charge injection compensation," IEEE J. Of Solid State Circuits, Vol. SC–23, pp. 736–741 (1988). The algorithm for the second-order Σ-Δ ADC with an integrator gain of unity is $$I(i+1) = \frac{i(i+1)}{2} I_{in} - \sum_{k=1}^{i} a_k(i+1-k)I_{ref} - \sum_{k=2}^{i+1} b_k I_{ref}, \qquad (3)$$

where $a_i$ and $b_i$ are respective digital outputs from the first and second first-order Σ-Δ modulation stages. A digital word formed by appropriately weighing the digital outputs $a_i$ and $b_i$ is given by $$2D = \sum_{k=1}^{i} a_k(i+1-k) - \sum_{k=2}^{i+1} b_k. \qquad (4)$$

Figure 5C:
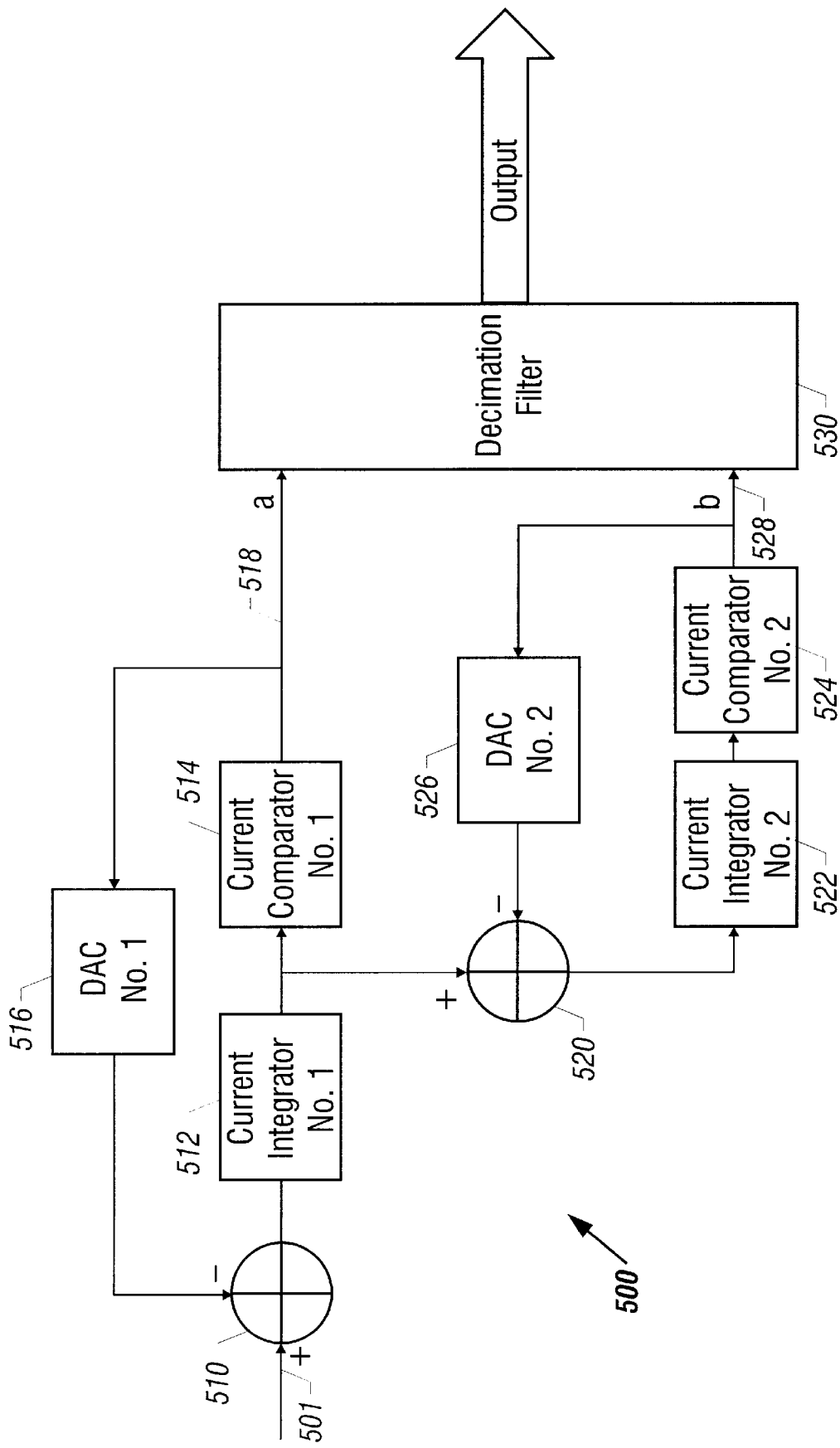
FIG. 5C is a block diagram showing the general layout of a second-order incremental $\Sigma$-$\Delta$ ADC.

FIG. 5C shows the general architecture of the current-mode second-order Σ-Δ ADC 500 in accordance with the invention. Two first-order Σ-Δ modulation loops are implemented to achieve an improved conversion speed and immunity to loop instabilities. The first Σ-Δ modulation loop is formed by a first current mixer 510, a first current integrator 512, a first current comparator 514 and a first digital-to-analog converter (DAC) 516. The second Σ-Δ modulation loop is formed by a second current mixer 520, a second current integrator 522, a second current comparator 524 and a second DAC 526. Both current comparators 514 and 524 send their outputs 518 and 528 to a decimation filter 530.

The outputs 518 and 528 from the two Σ-Δ modulators represent the analog current input 501 ($I_{in}$) and its out-of-band components, modulation noise, circuit noise and interference. Both current comparators 514 and 524 operate according to the same control logic: the comparator sends an output "1" if the current from the integrator is greater than the reference current $I_{ref}$, otherwise it produces a "0". For the D/A converters 516 and 526, the output is $(-I_{ref})$ if the output of the corresponding comparator is "1", otherwise it outputs nothing. The decimation filter 530 combines and processes signals 518 and 528 by attenuating the out-of-band energy and resampling them at the Nyquist rate.

Since each comparator follow an integrating stage, the offset and noise of the comparator do not affect the accuracy of the circuit as much as in other Nyquist rate A/D configurations wherein comparators directly measure the analog input.

Figure 6A:
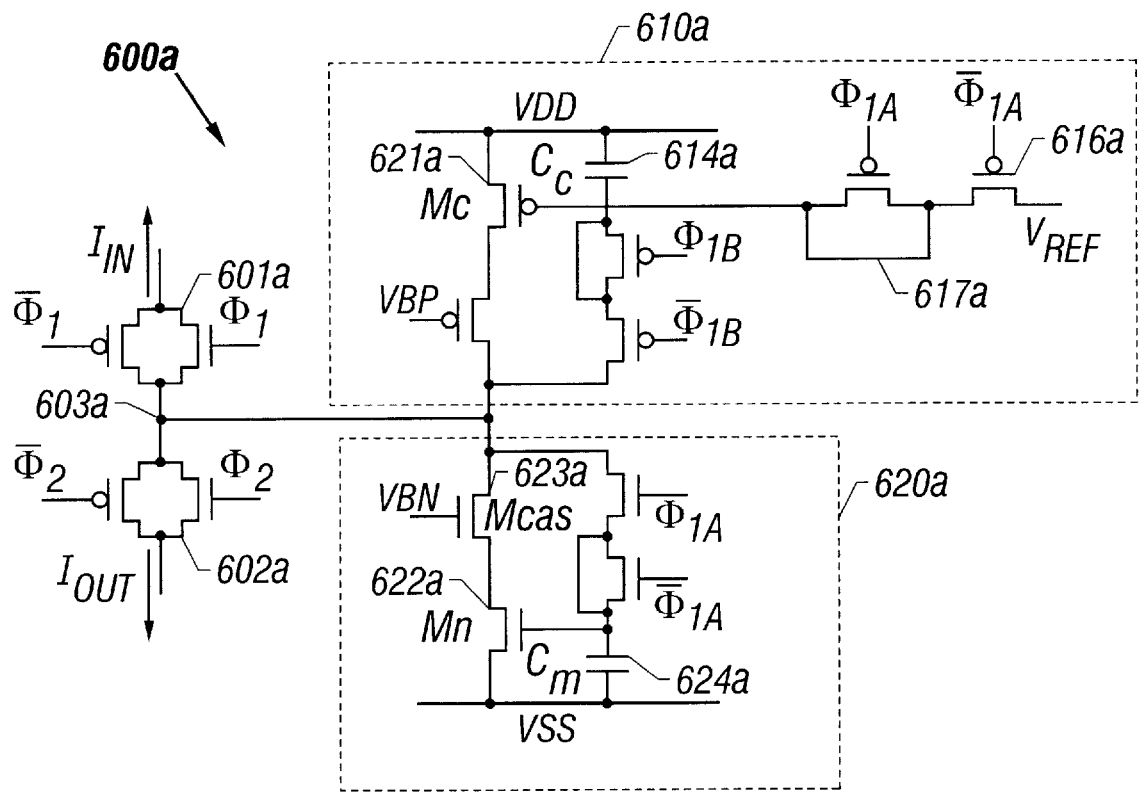
FIG. 6A is a circuit of a N-channel current copier cell according to one embodiment of the invention.

One aspect of the invention is a current copier cell which forms the building block of the current-mode second-order Σ-Δ ADC 500. FIG. 6A shows one embodiment of a N-channel current copier cell 600a which includes an input/output control, a copier cell 610a and a memory cell 620a. An input and output terminal 603a is connected to both the copier cell 610a and the memory cell 620a. The input/output control has two transistor switches 601a and 602a which respectively controls the input and output 603a of the current copier cell 600a by pulses φ1 and φ2. The copier cell 610a includes a copier transistor 612a ($M_c$), and a copier capacitor 614a ($C_c$). The memory cell 620a includes a memory transistor 622a ($M_M$) and a memory capacitor 624a ($C_M$). A unique feature of the current copier cell 600a is a constant offset current $I_B$ that is independent of the input current signals and is controlled by a reference voltage input 616a (Vref,p).

Figure 6B:
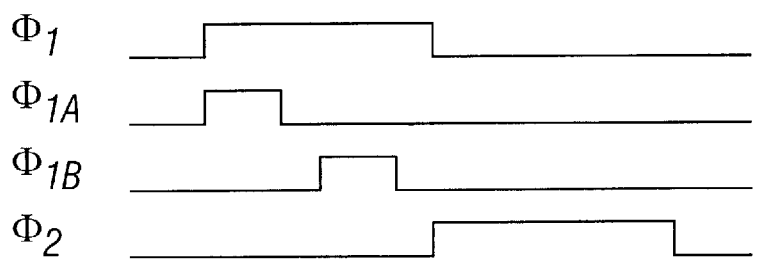
FIG. 6B is a diagram showing the pulse sequence for operation of the circuit of FIG. 6A.

The operation of the copier cell 600a is based on series of control pulses. The pulse sequence is shown in FIG. 6B.

During the period when the pulses φ1 and φ1A are ON, the value Iin+IB is memorized on the memory 624a (CM). When the pulse φ1A is OFF, the clock feedthrough corresponding to $\delta I_M$ which depends on Iin, is also added on the memory 624a ($C_M$). Thus, current ($I_{in}+I_B+\delta I_M$) is stored in the memory 624a ($C_M$).

Next, φ1B turns on for an integration period. During the period when the pulse φ1B is ON (φ1 still remains ON), the current ($I_B+\delta I_M$) is memorized on the copier capacitor 614a ($C_c$). When φ1B is OFF, the clock feedthrough corresponding to $\delta I_c$ is also added on $C_c$. Note that $\delta I_c$ is constant under the condition of $I_B>>\delta I_M$ because the bias current $I_B$ is constant. Thus, a total current of ($I_B+\delta I_M+\delta I_c$) is stored on $C_c$. After φ1B is OFF for one integration period, φ2 is turned on and thus the switch 602a is open. During the period when the pulse φ2 is ON, the output current $I_{out}$ at the switch 602a is the difference between the current $I_M$ of the memory transistor 622a ($M_M$) and the current $I_c$ of the copier transistor 612a ($M_C$)

$$I_{out}=I_M-I_C=(I_{in}+I_B+\delta I_M)-(I_B+\delta I_M+\delta I_C)=I_{in}-\delta I_C. \quad (5)$$

Currents $I_B$ and $\delta I_M$ are canceled in the output $I_{out}$. The output of the copier cell is the input $I_{in}$ plus a constant current $\delta I_c$. Since the feedthrough level $\delta I_c$ is independent of the input currents, it results in only a digital number offset in the analog-to-digital conversion and does not affect the conversion accuracy.

The copier cell 600a also implements an optional dummy switch at each transistor switch to compensate the charge injection both copier cell 610a and the memory cell 620a. Eichenberger and Guggenbuhl, "Dummy transistor compensation of analog MOS switches," IEEE Journal of Solid-State Circuits, Vol. 24, No. 4, pp. 1143–1146, August, 1989. In a dummy switch, two transistors of the same type are connected by shorting the drain of one transistor with the source of another. An inversed switching clock is applied to the gate of each dummy transistor. The dummy switch mechanism can improve the circuit performance but is not required in practicing the invention. For example, the transistor switch 617a for the bias control has two P-channel transistors to form as a dummy compensated switch.

In addition, a cascode transistor 623a ($M_{cas}$) is connected to the memory transistor 622a to increase the output resistance of the memory transistor 622a ($M_M$). The gate of the cascode transistor 623a is biased at a voltage $V_{BN}$.

Figure 6C:
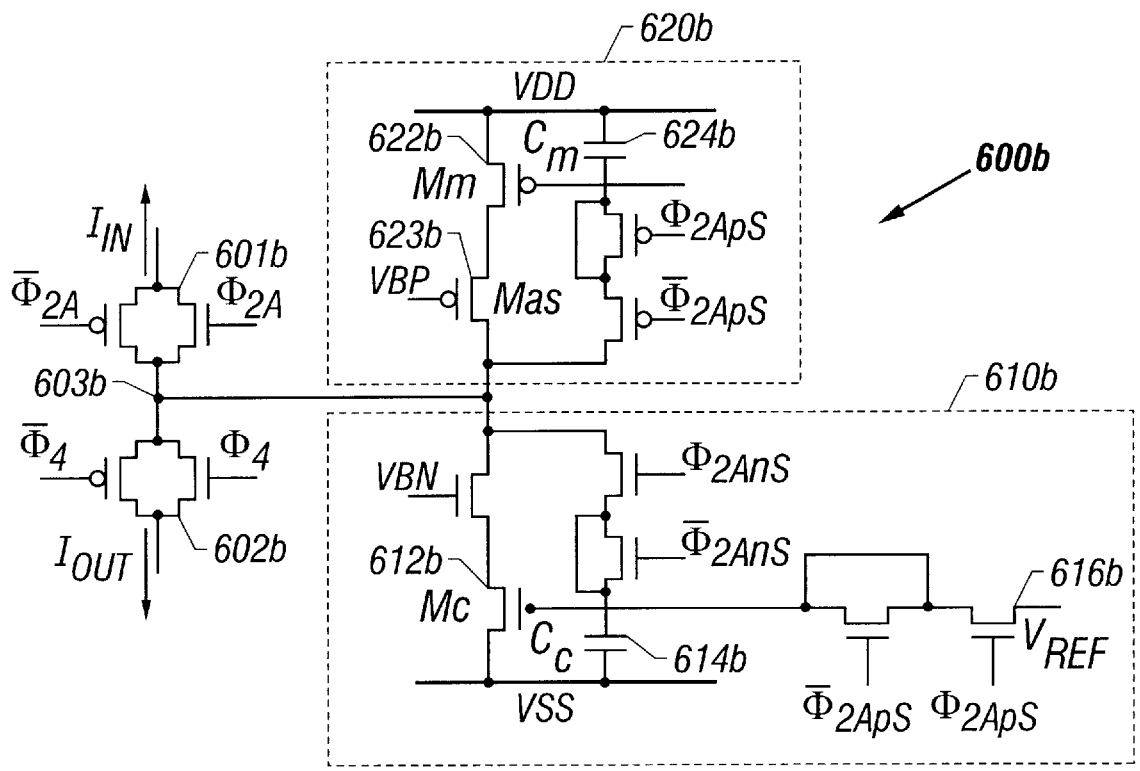
FIG. 6C is a circuit of a P-channel current copier cell according to one embodiment of the invention.
Figure 6D:
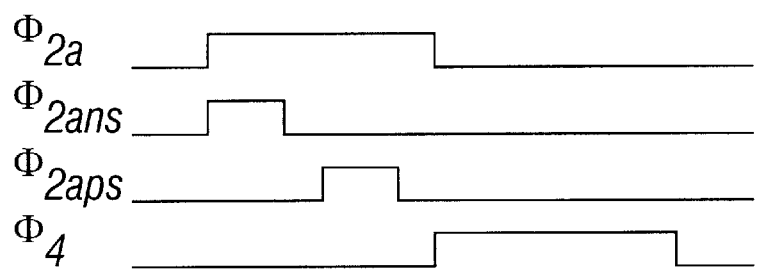
FIG. 6D is a diagram showing the pulse sequence for operation of the circuit of FIG. 6C.

Both P-channel and N-channel current copier cells are needed. FIGS. 6C and 6D show the P-channel version of the current copier cell 600b and its control pulse sequence, respectively. Similar to the cell 600a, cell 600b also has a copier cell 610b and a memory cell 620a that are connected to a common input and output terminal 603b.

Figure 7A:
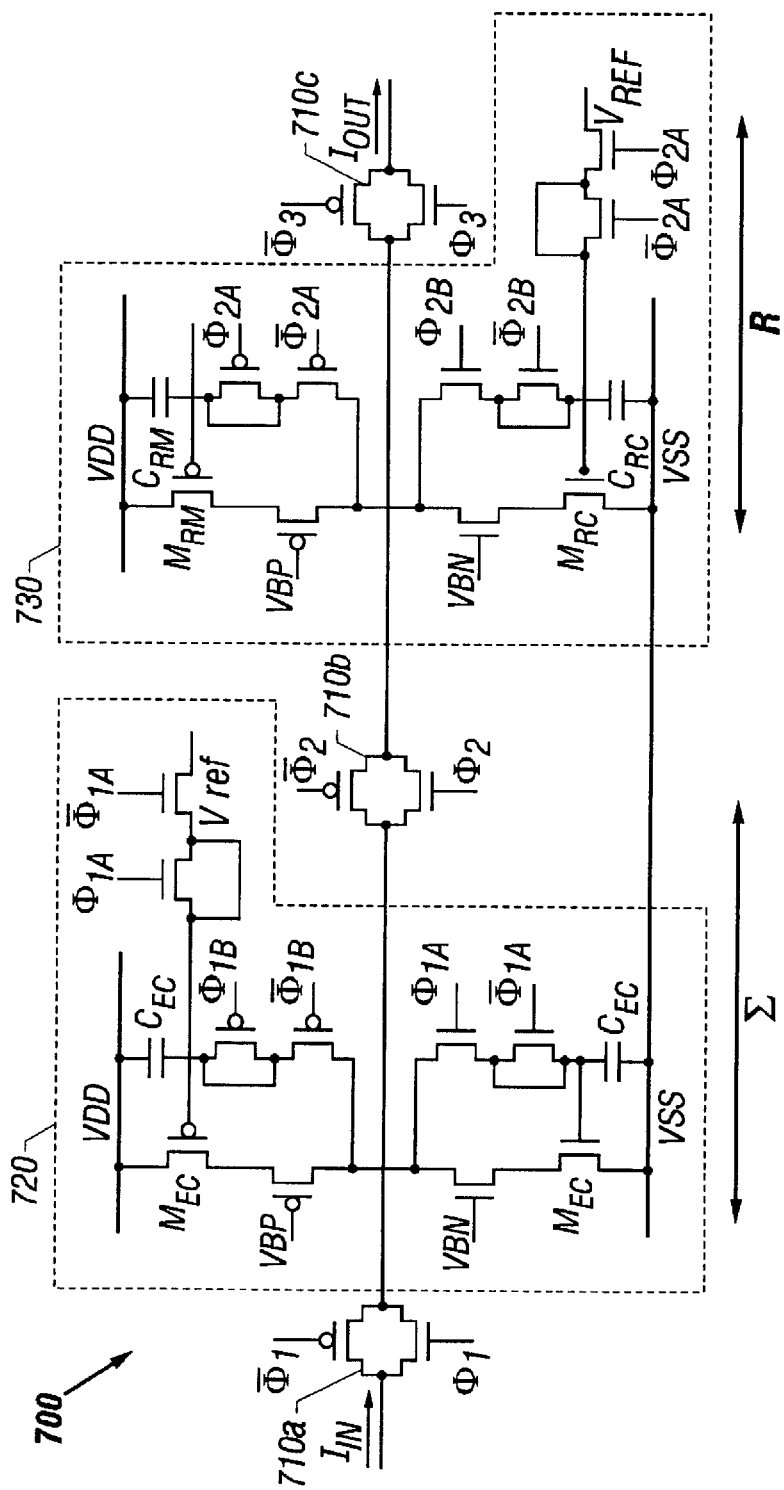
FIG. 7A shows one embodiment of a current integrator according to the invention.

FIG. 7A shows one embodiment 700 of the current integrator 512 and 522 based on the current copier cells in FIGS. 6A and 6C. The current integrator 700 includes a first transistor switch 710a, a current accumulator and temporary storage 720, a second switch 710b, a current holding register 730, and a third switch 710c. The accumulator 720 is in fact the N-channel current copier of FIG. 6A and the register 730 is the P-channel current copier of FIG. 6C.

Figure 7B:
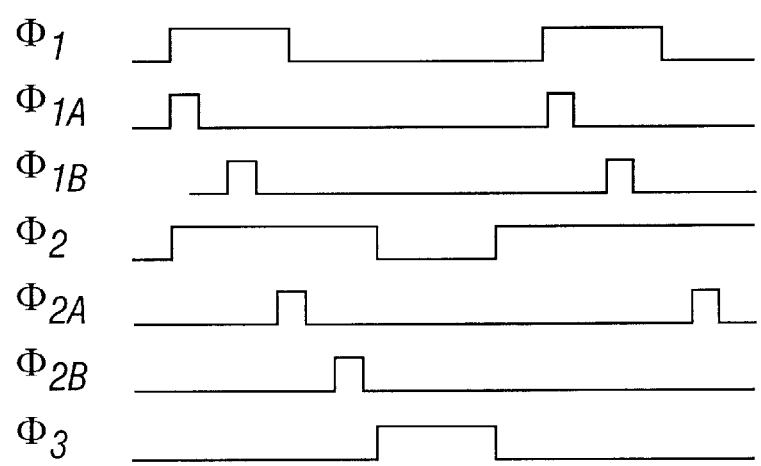
FIG. 7B is a diagram of the control pulse sequence for the circuit of FIG. 7A.

Pulse timing for operating the integrator 700 is shown in FIG. 7B. Initially, the integrator 700 is reset to an initial state by pulsing φ1A, φ1B, φ2A and φ2B so that capacitors $C_{\Sigma M}$, $C_{\Sigma C}$, $C_{RM}$, and $C_{RC}$ are reset at the voltages corresponding to the bias current $I_B$. Clocks φ1 and φ2 may overlap with each other because it is during the phases of φ1A, φ1B and φ2A and φ2B that the current is memorized on a copier.

During the phase φ1 (φ2 is also ON), the input current from 710a and the previous integrated current held in 730 are added and memorized on 720. Then, φ1 is OFF but φ2 continues in ON state. The accumulated value is memorized onto the current holding register 730. This completes one integration cycle and the newly integrated current value is available for processing in phase φ3. Thus, according to the pulse sequence of FIG. 7B, the output current $I_{out}$ from the current integrator 700 after the third clock cycle φ3 at the end of i-th integration period is $$I_{out}[i,3]=i\cdot[I_{in}-(\delta I_{\Sigma C}+\delta I_{RC})], \quad (6)$$

where $\delta I_{\Sigma C}$ and $\delta I_{RC}$ are the clock feedthrough levels of the accumulator cell 720 and the temporal register cell 730. Since ($\delta I_C+\delta I_{RC}$) is a constant independent of the input current, the output current is a true integration of the input (e.g., $iI_{in}$) plus a constant feedthrough level.

Referring to FIG. 5, the current comparators (514 and 524) and the DACs (516 and 526) preferably operate based on an identical reference current Iref. This reference current can be generated by a current generator 800 shown in FIG. 8A. The current generator 800 includes a current source 801, two reference current sources 810 and 830 which provide substantially identical currents to the comparators and two reference current sinks 820 and 840 which provide substantially identical currents to the DACs. Cells 810 and 820 are connected in series and cells 830 and 840 are connected in series.

All currents are supplied by the current source 801 which is controlled by a control reference voltage $V_{ref}$. Each of the reference current sources is a P-channel current copier and each of the reference current sinks is a N-channel current copier cell with a cascode transistor. The current copier cells are used to minimize the effect of transistor mismatch. Unlike the current copier cell 600 of FIG. 6A, the current copier may not have good absolute accuracy. However, the relative current accuracy at a fixed current level is well suited for this particular application.

Figure 8A:
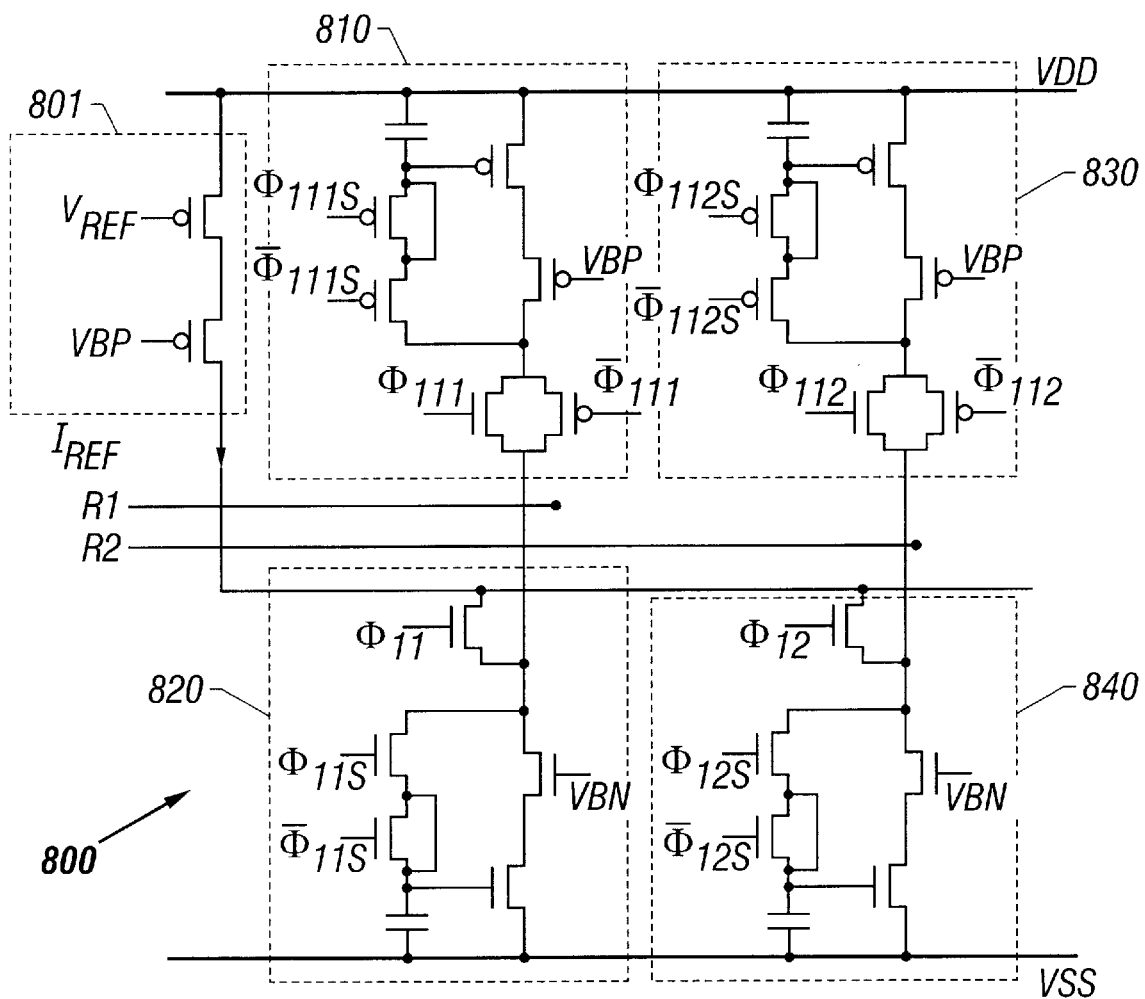
FIG. 8A shows one embodiment of a current generator according to the invention.
Figure 8B:
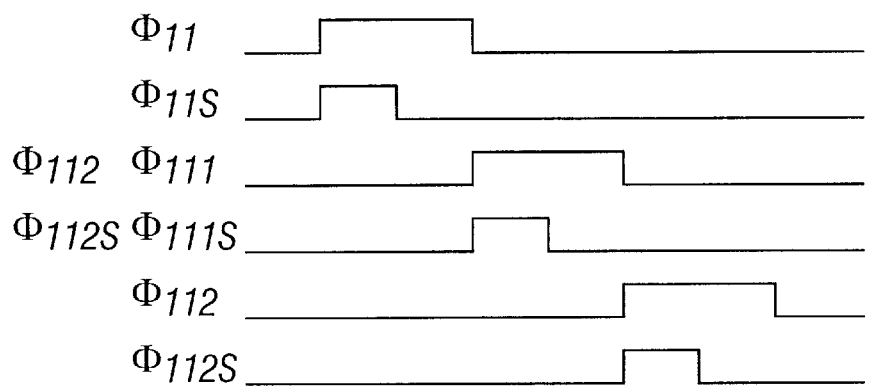
FIG. 8B is a diagram of the control pulse sequence for the circuit of FIG. 8A.

FIG. 8B shows the pulsing sequence for operation of the current generator 800. First, the first N-channel cell 810 memorizes Iref. Next, the current Iref is copied to the first P-channel cell 820 while the second N-channel cell 803 memorizes the reference current $I_{ref}$. Finally, the second P-channel cell 840 copies $I_{ref}$.

Figure 9A:
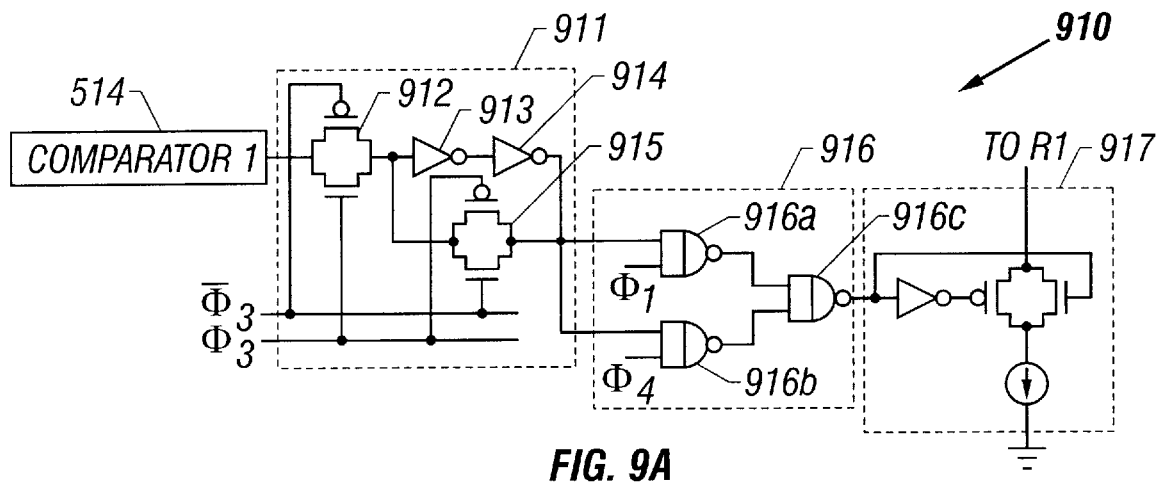
FIGS. 9A and 9B respectively show 1-bit digital-to-analog converters for the first and second modulation loops for the circuit of FIG. 5C.
Figure 9B:
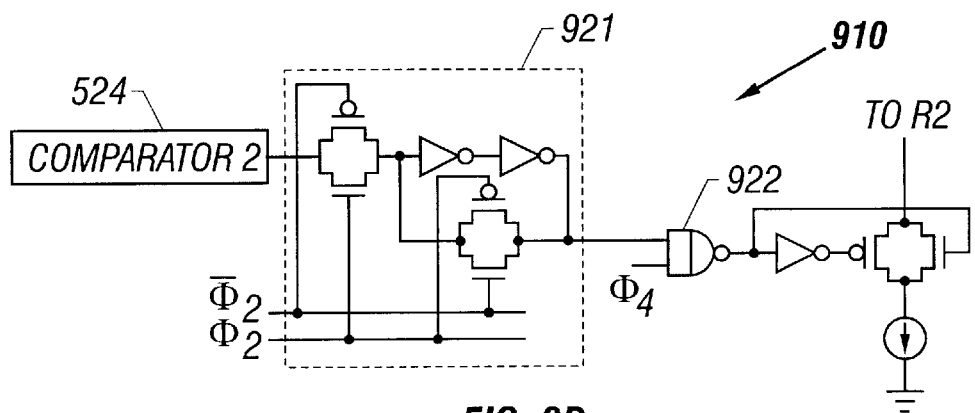

The DACs 516 and 526 of FIG. 5 may be implemented by 1-bit D/A converters 910 and 920 of FIGS. 9A and 9B. The 1-bit DAC 910 has three functional circuits in series: a current latch 911, a logic 916 and an output 917 to input terminal R1 of the integrator 800 (FIG. 8A). The current latch 911 is made of two current transmission gates 912 and 915 and two inserters 913 and 914. Each current transmission gate (912 or 915) has one P-channel transistor and a N-channel transistor that are controlled by pulse φ3 and its complementary pulse. Therefore, the output current of the latch 911 remains the same during the complementary phase of the pulse φ3 after φ3 is off. The logic 916 has three NAND gates 916a, 916b and 916c and operates to turn on or off the reference current $I_{ref}$ during phases φ1 and φ4 to the output 917 depending on the output of the comparator 514. The 1-bit DAC 920 is similar but the logic 922 is a simple NAND gate which operates during phase φ4.

In operation, if the comparator 514 or 524 produces an output of "1", the logic circuit is activated and the reference current $I_{ref}$ is subtracted from the temporal register R of the integrator, e.g., register 730 of FIG. 7A. If the comparator 514 or 524 produces an output of "0", the logic circuit 916 is not activated, thus D/A converter outputs nothing the integrator continues current integration as previously described.

Figure 10:
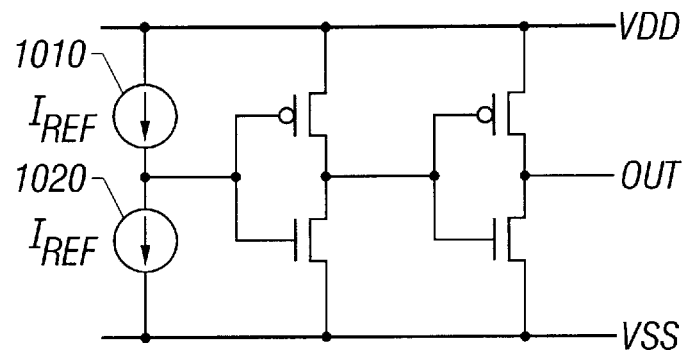
FIG. 10 shows one embodiment of the current comparator in the circuit of FIG. 5C.

FIG. 10 shows an implementation of the current comparators 514 and 524 of FIG. 5. The serial reference current source 1010 and the current sink 1020 may be the current cells described in FIG. 8A. If an input current I to the sink 1020 is less than Iref, transistor in the current source 1010 operate in a linear region while the transistors in the current sink 1020 remain in saturation. Thus, the input voltage of the comparator becomes "high" and the comparator then generates a "low" at the output. Conversely, if I is more than Iref, the comparator outputs a "high".

Operation of Current-Mode Second-Order $\Sigma$-$\Delta$ ADC

Figure 11A:
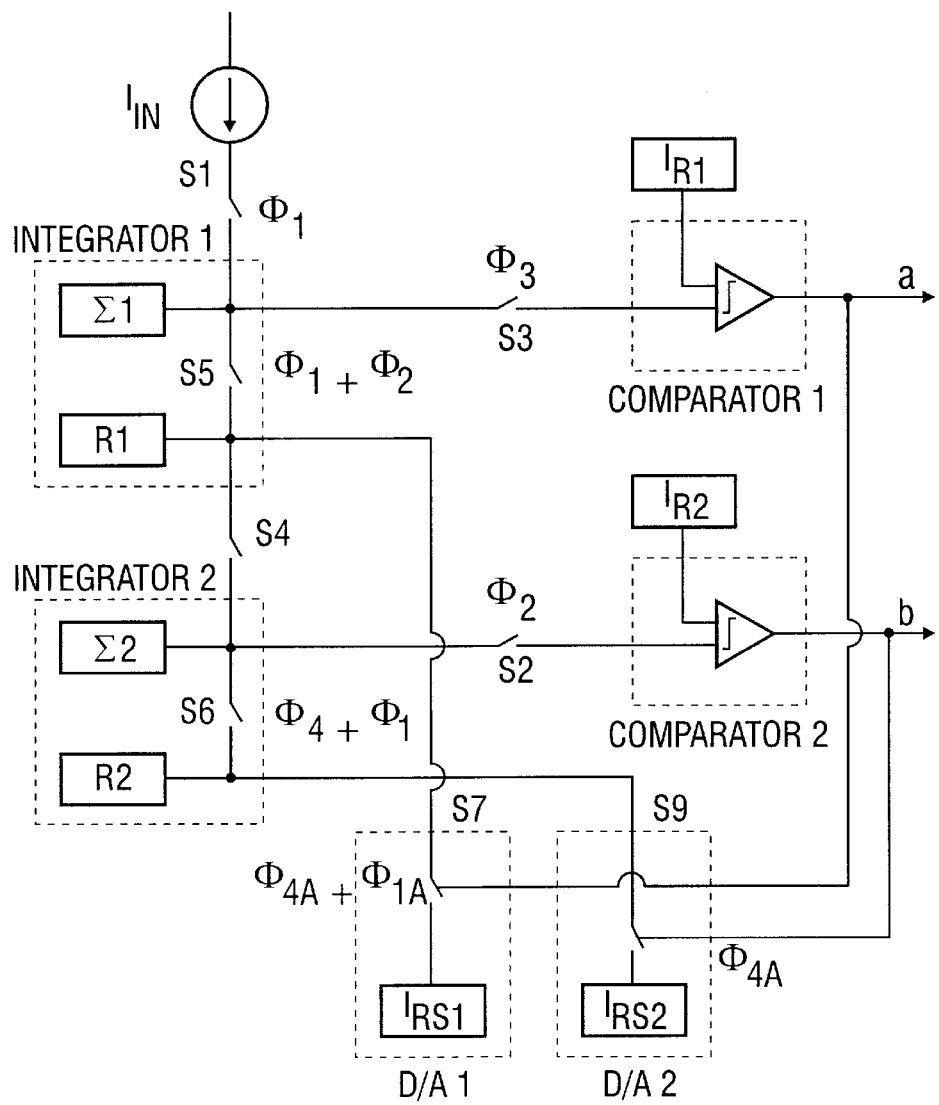
FIG. 11A is a block diagram showing one implementation of the second-order incremental Σ-Δ ADC of the invention.
Figure 11B:
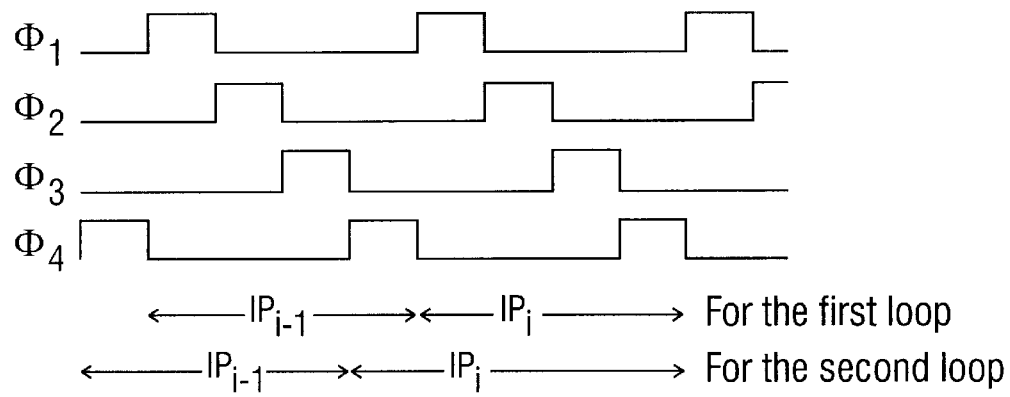
FIG. 11B is a diagram of the control pulse sequence for the circuit of FIG. 11A.

FIG. 11A shows an operational block diagram representing the current-mode second-order $\Sigma$-$\Delta$ ADC 500 of FIG. 5. The symbol Si (i=1, 2, ..., 9) represent transistor switches. $\Sigma$1 and $\Sigma$2 represent accumulators which may be the N-channel current copier cell 720 of FIG. 7A. R1 and R2 are temporal registers which may be the P-channel current copier cell 730 of FIG. 7A. and One embodiment of the control pulse sequence of the transistor switches S1–S9 is illustrated in FIG. 11B. Four clock phases form one integration cycle. Clocks $\phi j$ (j=1, 2, 3, and 4) are not necessarily non-overlapped.

Each clock cycle performs the following functions: first, memorizing the current; second, copying the current; and third, comparing the output current of the integrator with the reference current. During memorizing the current, subtracting the reference current from the current stored in the temporal register of the integrator is performed if I is greater than Iref. It should be noted that the clock phase in the second $\Sigma$-$\Delta$ modulation loop is shifted by one clock phase with respect to that of the first loop. Table 1 summarizes the roles of each clock cycle for the two $\Sigma$-$\Delta$ modulation loops.

TABLE 1

| Clock Cycle | First Loop | Second Loop |
| --- | --- | --- |
| $\phi$4 | | memorizing input/subtracting |
| $\phi$1 | memorizing input/subtracting | copying ($\Sigma$2→R2) |
| $\phi$2 | copying ($\Sigma$1→R1) | comparing |
| $\phi$3 | comparing | |
| $\phi$4 | | memorizing input/subtracting |

The following is a detailed description of the operations during each integration period in each clock cycle. The memorized or copied current in an integrator is denoted by $I_{\alpha k \beta}[i,j]$ where k=1 and 2 is the identification number of an integrator, $\alpha$ and $\beta$ represents copiers, i corresponds to the i-th integration period and j to the clock cycle (j=1, 2, 3, or 4). Each integrator has four current components: $I_{\Sigma kM}$, $I_{\Sigma kC}$, $I_{RkM}$ and $I_{RkC}$. The output currents of an accumulator $\Sigma$ and a current holding register R are $I_{\Sigma K} \equiv (I_{\Sigma kM} - I_{\Sigma kC})$ and $I_{RK} \equiv (I_{RkM} - I_{RkC})$, respectively. For simplicity, $I_{\alpha k}$ is used to represent a current that interacts between an accumulator $\Sigma$ and a temporal register R.

Assume the clock feedthrough $\delta I$ in the circuit of FIG. 11A is zero. The following are evident from the Table 1:

$$I_{\Sigma 1}[i,2] = I_{\Sigma 1}[i,3] = I_{\Sigma 1}[i,4] = I_{\Sigma 1}[i,1], \quad (7)$$

$$I_{R1}[i,3] = I_{R1}[i,4] = I_{R1}[i+1,1] = I_{R1}[i,2] = I_{\Sigma 1}[i,1], \quad (8)$$

$$I_{\Sigma 2}[i,1] = I_{\Sigma 2}[i,2] = I_{\Sigma 2}[i,3] = I_{\Sigma 2}[i,4], \quad (9)$$

$$I_{R2}[i,2] = I_{R2}[i,3] = I_{R1}[i+1,4] = I_{R1}[i,1] = I_{\Sigma 2}[i,4]. \quad (10)$$

Figure 11C:
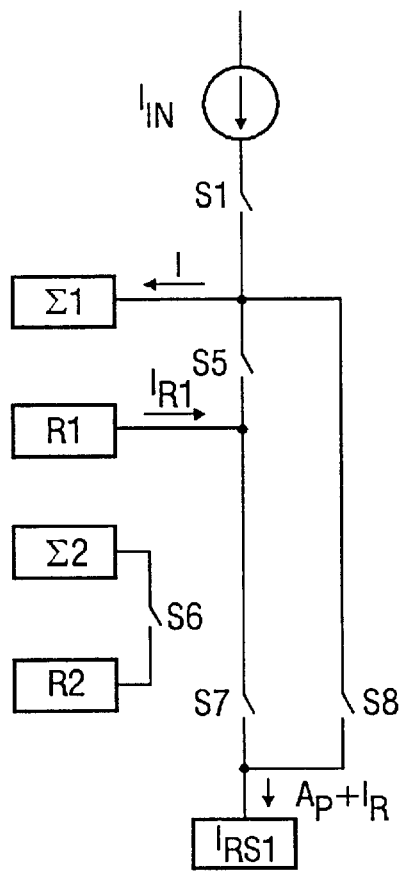
FIGS. 11C, 11D, 11E and 11F show equivalent circuits of the circuit of FIG. 11A during different clock cycles.

FIG. 11C shows the equivalent circuit to the circuit of FIG. 11A during the first clock cycle $\phi$1. Switches S1 and S5 are closed. The input current Iin is memorized at the first accumulator $\Sigma$1.

Figure 11D:
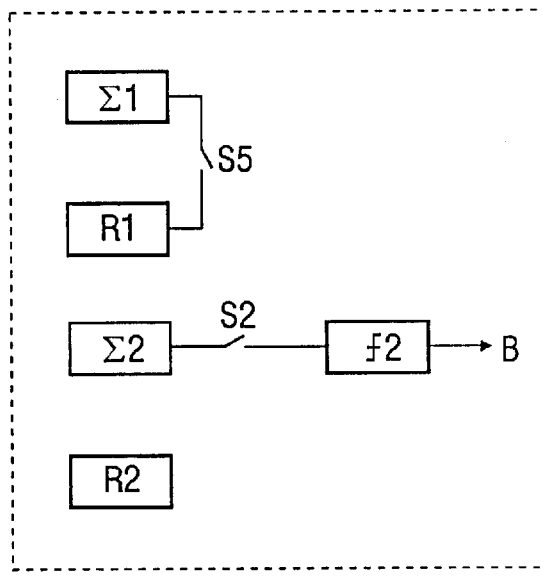

During the second clock cycle $\phi$1, S5 is closed and $\Sigma$1 is in the copying phase while R1 is in the memorizing phase. Iin is copied at R1. FIG. 11D shows the equivalent circuit to the circuit of FIG. 11A. Therefore, the following current relations are obtained:

$$I_{\Sigma 1}[1,2] = I_{IN}, \quad (11)$$

$$I_{R1}[1,2] = I_{IN}. \quad (12)$$

During the i-th integration period in the first clock cycle $\phi$1, sum of the input current Iin and the current memorized at R1 (e.g., $I_{R1}[i-1,4]$) is memorized at $\Sigma$1. During the i-th integration period in the second clock cycle $\phi$2, $\Sigma$1 copies the current to R1. Thus, $I_{\Sigma 1}[i,1]$ and $I_{R1}[i,2]$ are:

$$I_{\Sigma 1}[i,1] = I_{R1}[i-1,4] + I_{IN}, \quad (13)$$

$$I_{R1}[i,2] = I_{\Sigma 1}[i,1]. \quad (14)$$

Figure 11E:
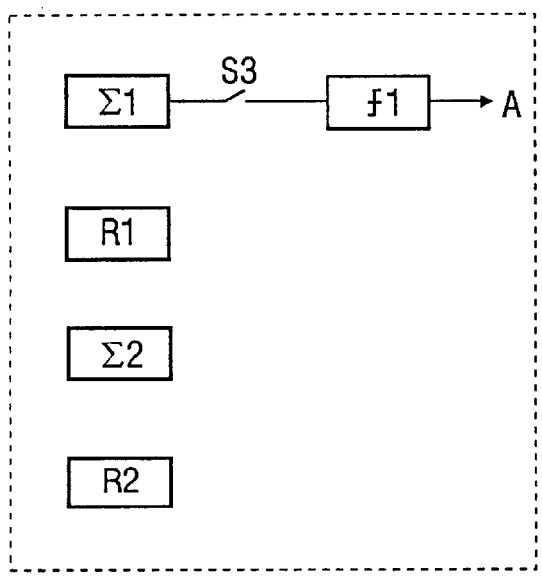

During the third clock cycle $\phi$3, S3 is closed and $I_{\Sigma 1}$ is compared with the reference current $I_{ref}$. Now the circuit of FIG. 11A is effectively reduced to an equivalent circuit shown in FIG. 11E. If $I_{\Sigma 1} > I_{ref}$, the output of the comparator is "1"; otherwise, the output is "0".

Figure 11F:
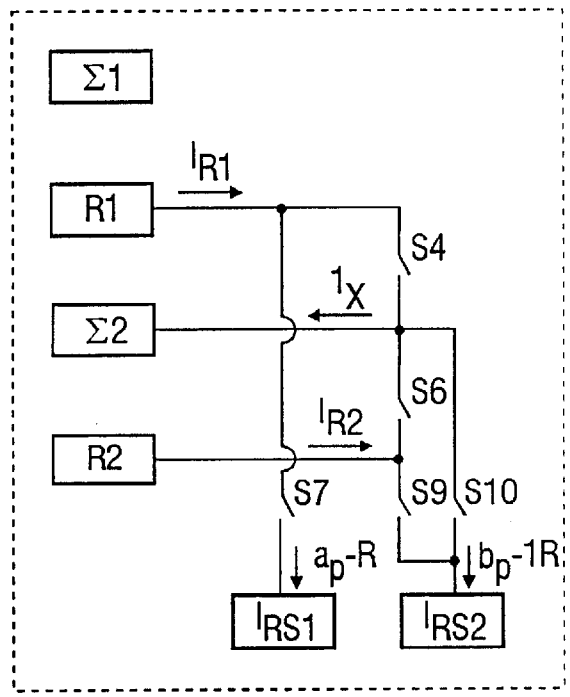

During the (i−1)th integration period in the fourth clock cycle $\phi$4, the circuit of FIG. 11A is effectively reduced to an equivalent circuit shown in FIG. 11F. If $a_{i-1} = 0$, the current $I_{R1}$ remains the same. If $a_{i-1} = 1$, $I_{ref}$ is subtracted from the current $I_{R1}[i-1,3]$ to produce $I_{R1}[i-1,4]$:

$$I_{R1}[i-1,4] = I_{R1}[i-1,3] - a_{i-1} \cdot I_{ref}. \quad (15)$$

This leads to the follow current relations:

$$I_{\Sigma 1}[i, 1] = I_{\Sigma 1}[i-1, 1] - a_{i-1} \cdot I_{ref} + I_{IN} \quad (16)$$

$$I_{\Sigma 1}[p, 3] = p \cdot I_{IN} - \sum_{i=1}^{p-1} a_i \cdot I_{ref} \quad (17)$$

The above operations in the first loop are also performed in the second loop except that the clock cycle is $$L_{1p} = \frac{1 + \sum_{i=1}^{p-1} a_i \cdot (p-i) + \sum_{i=1}^{p-1} b_i}{\frac{(p-1) \cdot p}{2}} \cdot I_{ref}. \quad (18)$$

shifted by one clock cycle. The i-th integration period starts with the fourth clock cycle $\phi$4. In addition, the input current of the second loop is the output current $I_{R1}$ of the register copier of the first integrator. Following similar analysis as in the first loop, the current $I_{\Sigma 2}[p,2]$ can be expressed as:

$$I_{\Sigma 2}[p, 2] = \frac{(p-1) \cdot p}{2} \cdot I_{IN} - \sum_{i=1}^{p-1} a_i \cdot I_{ref} - \sum_{i=1}^{p-1} b_i \cdot I_{ref} \quad (19)$$

From Equations (17) and (18), the comparison level of the first loop, $L_{1p}$, and that of the second loop, $L_{2p}$, can be written as:

$$L_{1p} = \frac{1 + \sum_{i=1}^{p-1} a_i}{p} \cdot I_{ref}, \quad (20)$$

If $L_{1p} \geq I_{\Sigma 1}[p,3]$, then $a_p = 1$. If $L_{2p} > I_{\Sigma 2}[p,2]$, then $b_p = 1$, otherwise $b_p = 0$.

The quantization error of an ideal ADC can be represented by:

$$0 \leq I_{IN} - DN \cdot I_{LSB} \leq I_{LSB}, \quad (21)$$

where DN is the digital representation of $I_{IN}$ and $I_{LSB}$ is the analog current corresponding to the least significant bit. Based on $0 \leq I_{\Sigma 2}[p,2] \leq 2I_{ref}$, $I_{LSB}$ and DN can be expressed as:

$$I_{LSB} = \frac{2 \cdot I_{ref}}{(p-1) \cdot p}, \quad (22)$$

$$DN = \sum_{i=1}^{p-1} a_i \cdot (p-i) + \sum_{i=2}^{p-1} b_i. \quad (23)$$

The resolution of the ADC is $$n = 1b(I_{ref}/I_{LSB}) = 1b((p-1) \cdot p/2)[\text{bits}], \quad (24)$$

where 1b(p) represents the binary logarithm of p. Table 2 shows the relation between the resolution and the total number of integration periods (i.e., oversampling ratio), p.

Figure 12A:
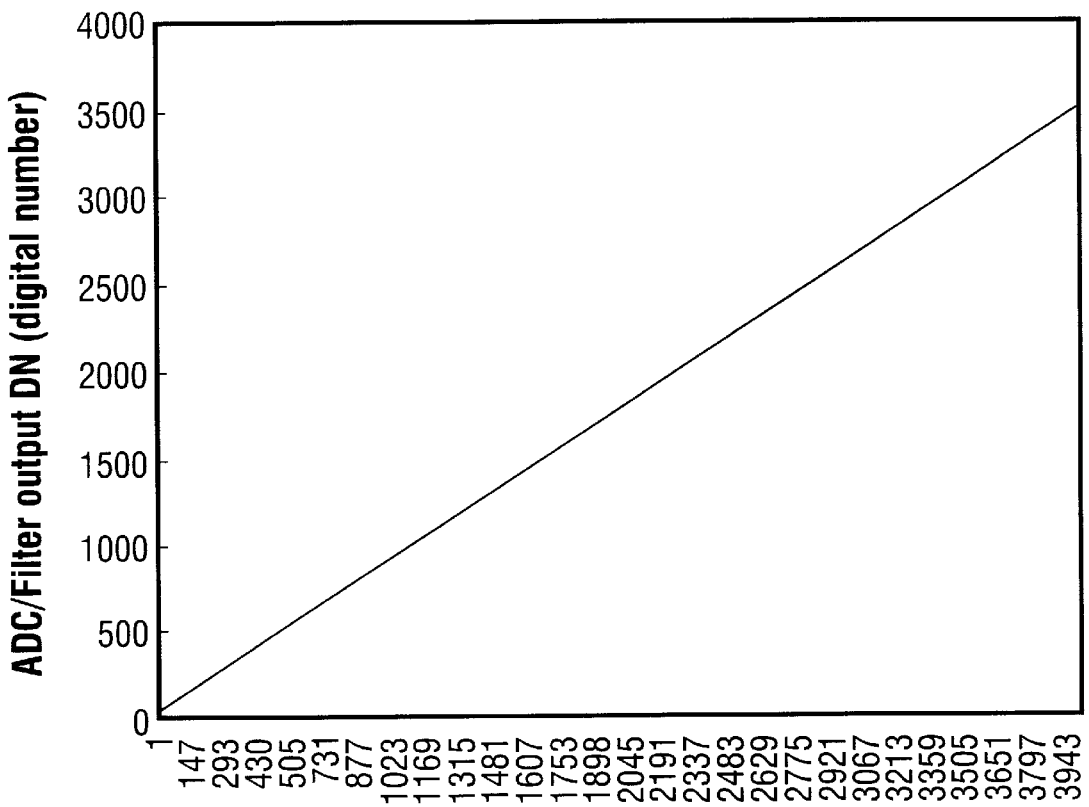
FIG. 12A is a chart showing the transfer curve of a 12-bit current-mode ADC at 5 KHz conversion rate in accordance with the invention.
Figure 12B:
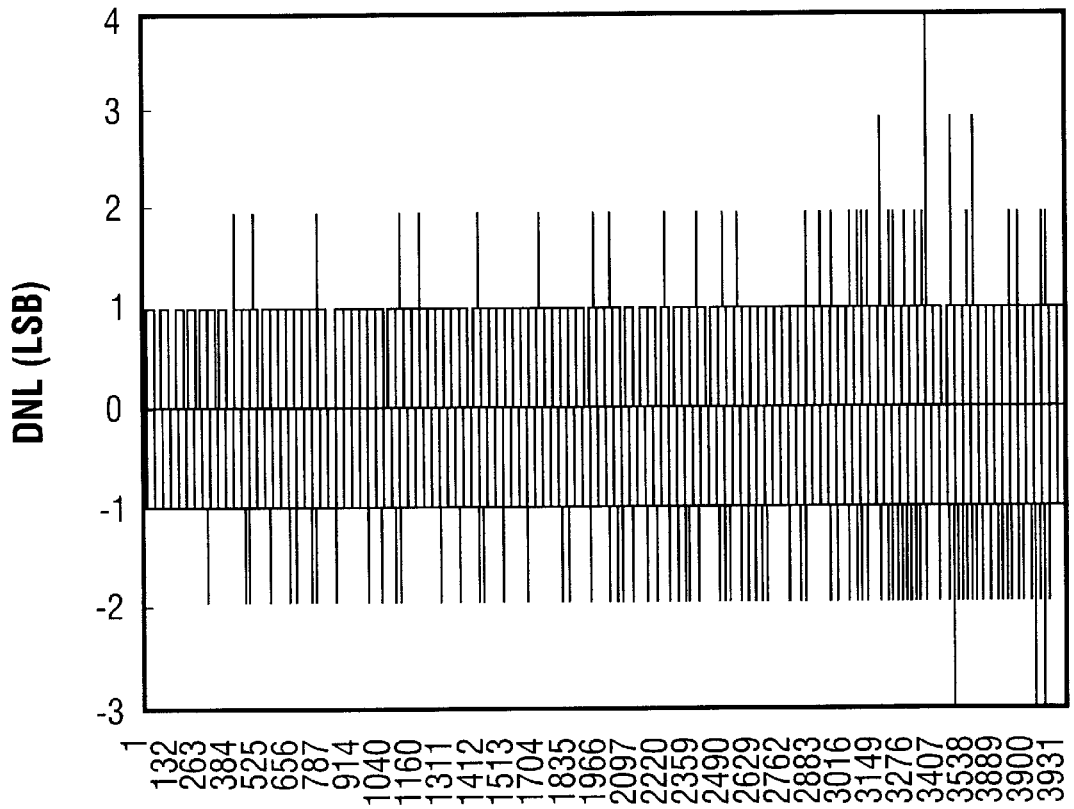
FIG. 12B is a chart showing the differential non-linearity as a function of digitization steps of a 12-bit current-mode ADC at 5 KHz conversion rate in accordance with the invention.

The inventors tested a current-mode 12-bit ADC circuit based on FIG. 11A by using a computer-controlled current source and an off-chip digital filter. The output data from the filter was read by a computer data acquisition board. The input current ramp has 4096 steps with a step increment of 4 nA. At each input step, 20 samples were acquired. The DC current bias was about: 40 μA. The transfer curve of the tested ADC is shown in FIG. 12A. FIG. 12B further shows the digital number level as a function of the digitization steps. The 12-bit ADC consumed a total of about 800 μW of power when operating at a conversation rate of about 5 KHZ. Differential ono-linearity measurements showed that the accuracy of the ADC was 10 bits.

TABLE 2

| ADC Resolution n (bits) | Oversampling Ratio p |
|---|---|
| 6 | 12 |
| 7 | 17 |
| 8 | 24 |
| 9 | 33 |
| 10 | 46 |
| 11 | 65 |
| 12 | 92 |
| 13 | 129 |
| 14 | 182 |

Although the present invention has been described in detail with reference to the preferred embodiments, one ordinarily skilled in the art to which this invention pertains will appreciate that various modifications and enhancements may be made.

For example, the current copier cells of FIGS. 6A and 6C are disclosed to form a current-mode second-order Σ-Δ incremental ADC (FIG. 11A). However, current-mode Σ-Δ incremental ADCs with a single-stage modulation loop or more than two loops may also be constructed. A single-stage Σ-Δ ADC based on the current copier cells of FIGS. 6A and 6C may be formed using the layout of FIG. 5A and additional integration cycles may be needed to achieve the same accuracy as the second-order Σ-Δ incremental ADC. A Σ-Δ incremental ADC with more than two modulation loops may be used to achieve even higher conversion accuracy and resolution than that of the second-order Σ-Δ incremental ADC.

In addition, the circuits disclosed here may be used in any analog-to-digital circuit application or other current-mode circuits for applications other than A/D conversions.

These and other variations and modifications are intended to be encompassed by the follow claims.

What is claimed is:

1. A circuit, comprising:
    an input and output terminal;
    a memory cell connected to said input and output terminal, said memory cell having a memory capacitor that stores charges from said input and output terminal, a memory transistor connected to said memory capacitor and configured to control current in said memory capacitor; and
    a copier cell connected to said input and output terminal, said copier cell having a copier capacitor, a copier transistor connected to said copier capacitor and configured to control a current in said copier capacitor, and a bias element that produces a bias current in said copier cell that is substantially independent of an input current from said input and output terminal,
        wherein said memory cell and said copier cell are operable to produce an output current that deviates from said input current by a constant bias.

2. A circuit as in claim 1, wherein said memory cell further comprises a cascade transistor connected to said memory transistor to increase the output resistance.

3. A circuit as in claim 1, wherein said copier cell further includes a first transistor switch in said bias element to control said bias current.

4. A circuit as in claim 1, wherein said copier cell is formed by a plurality of P-channel transistors and said memory cell is formed by a plurality of N-channel transistors.

5. A circuit as in claim 1, wherein said copier cell is formed by a plurality of N-channel transistors and said memory cell is formed by a plurality of P-channel transistors.

6. A circuit, comprising:
    an input terminal, receiving an input current;
    a current integrator connected to said input terminal and configured to perform integration of said input current;
    a current comparator receiving an integrated current from said current integrator and producing a digital output according to a comparison of said integrated current with a reference current; and
    a negative feedback loop including a current digital-to-analog converter that operates based on said reference current and feeding an analog representation of said digital output from said current comparator to said input terminal, said feedback loop operating to minimize noise in said digital output.

7. A circuit as in claim 6, wherein said current integrator includes at least one P-channel current copier cell and one N-channel copier, each comprising:
    an input and output terminal;
    a memory cell connected to said input and output terminal, said memory cell having a memory capacitor that stores charges from said input and output terminal, a memory transistor connected to said memory capacitor and configured to control a current in said memory capacitor; and
    a copier cell connected to said input and output terminal, said copier cell, having a copier capacitor, a copier transistor connected to said copier capacitor and configured to control a current in said copier capacitor, and a bias element that produces a bias current in said copier cell that is substantially independent of an input current from said input and output terminal,
        wherein said memory cell and said copier cell is operable to produce an output current that deviates from said input current by a constant bias.

8. A circuit as in claim 7, further comprising an extra analog-to digital loop which comprises:
- a second input terminal, connected to said current integrator and configured to receive said integrated current therefrom;
- a second current integrator connected to said second input terminal and configured to perform integration of said integrated current;
- a current comparator receiving a second integrated current from said second current integrator and producing a second digital output according to a comparison of said second integrated current with a second reference current; and
- a second negative feedback loop including a second current digital-to-analog converter that operates based on said second reference current and feeding an analog representation of said second digital output from said second current comparator to said second input terminal, said second feedback loop operating to minimize noise in said second digital output.

9. A circuit, comprising:
- a semiconductor substrate;
- a sensing array formed on said substrate and configured to have a plurality of photosensitive pixels, said sensing array operating to receive an input image and produce a corresponding current array indicative of said input image;
- at least one current-mode analog-to-digital convert formed on said substrate and connected to at least one pixel of said sensing array, said converter operable to convert analog current signals into digital signals which forms a digital representation of said input image.

10. A circuit as in claim 9, wherein said current-mode analog-to-digital converter comprises:
- an input terminal, receiving an input current;
- a current integrator connected to said input terminal and configured to perform integration of said input current;
- a current comparator receiving an integrated current from said current integrator and producing a digital output according to a comparison of said integrated current with a reference current; and
- a negative feedback loop including a current digital-to-analog converter that operates based on said reference current and feeding an analog representation of said digital output from said current comparator to said input terminal, said feedback loop operating to minimize noise in said digital output.

11. A circuit as in claim 10, wherein said current integrator includes at least one P-channel current copier cell and one N-channel copier, each comprising:
- an input and output terminal;
- a memory cell connected to said input and output terminal, said memory cell having a memory capacitor that stores charges from said input and output terminal, a memory transistor connected to said memory capacitor and configured to control a current of said memory capacitor; and
- a copier cell connected to said input and output terminal, said copier cell having a copier capacitor, a copier transistor connected to said copier capacitor and configured to control a current of said copier capacitor, and a bias element that produces a bias current in said copier cell that is substantially independent of an input current from said input and output terminal,
  - wherein said memory cell and said copier cell is operable to produce an output current that deviates from said input current by a constant bias.

12. A circuit as in claim 11, wherein said current-mode analog-to-digital converter further comprises an extra analog-to digital loop which includes:
- a second input terminal, connected to said current integrator and configured to receive said integrated current therefrom;
- a second current integrator connected to said second input terminal and configured to perform integration of said integrated current;
- a current comparator receiving a second integrated current from said second current integrator and producing a second digital output according to a comparison of said second integrated current with a second reference current; and
- a second negative feedback loop including a second current digital-to-analog converter that operates based on said second reference current and feeding an analog representation of said second digital output from said second current comparator to said second input terminal, said second feedback loop operating to minimize noise in said second digital output.

* * * * *